(12) United States Patent
Lange et al.

(10) Patent No.: US 9,431,587 B2
(45) Date of Patent: Aug. 30, 2016

(54) LED LIGHT SYSTEM

(71) Applicant: OSRAM GmbH, München (DE)

(72) Inventors: Stefan Lange, Augsburg (DE); Jörg Frischeisen, Schwabmünchen (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 14/700,340

(22) Filed: Apr. 30, 2015

(65) Prior Publication Data

US 2015/0311406 A1 Oct. 29, 2015

Related U.S. Application Data

(63) Continuation of application No. PCT/EP2013/069885, filed on Sep. 24, 2013.

(30) Foreign Application Priority Data

Oct. 30, 2012 (DE) .......... 10 2012 219 873

(51) Int. Cl.
H01L 29/20 (2006.01)
H01L 33/00 (2010.01)
H01L 33/50 (2010.01)
F21K 99/00 (2016.01)
H01L 25/075 (2006.01)

(52) U.S. Cl.
CPC .............. H01L 33/504 (2013.01); F21K 9/56 (2013.01); H01L 25/0753 (2013.01); H01L 33/501 (2013.01); H01L 33/502 (2013.01); H01L 33/507 (2013.01); H01L 2924/0002 (2013.01)

(58) Field of Classification Search
CPC . H01L 33/504; H01L 33/501; H01L 33/502; H01L 25/0753; H01L 2924/0002; H01L 33/507; F21K 9/56
See application file for complete search history.

(56) References Cited

U.S. PATENT DOCUMENTS

| 6,234,648 B1 | 5/2001 | Börner et al. |
| 7,213,940 B1 | 5/2007 | Van De Ven et al. |
| 9,101,029 B2 * | 8/2015 | Shamoto ............ H05B 33/0872 |

(Continued)

FOREIGN PATENT DOCUMENTS

| DE | 10 2010 034 913 A1 | 2/2012 |
| DE | 10 2010 034 915 A1 | 2/2012 |

(Continued)

Primary Examiner — Donald Raleigh
(74) Attorney, Agent, or Firm — DLA Piper LLP (US)

(57) ABSTRACT

A light system, wherein a first device that partly converts radiation of a first group is disposed in front of a portion of the first group, wherein the first device includes a phosphor-containing layer that converts a portion of primary radiation into secondary radiation having a longer wavelength, wherein the second group emits radiation having a greater wavelength than the first group, a second device that partly converts primary radiation of the first group, the second device being in front of a portion of the first group, wherein a converter exhibits a temperature dependence based on a different temperature dependence of the refractive index of a phosphor and a matrix embedding the phosphor, and the phosphor and matrix have at room temperature a difference in the refractive index is small and at operating temperature the difference in the refractive index is at least 1.5 times that at room temperature.

17 Claims, 7 Drawing Sheets

(56) References Cited

U.S. PATENT DOCUMENTS

| | | | |
|---|---|---|---|
| 2008/0303407 A1* | 12/2008 | Brunner | C09K 11/0883 313/496 |
| 2011/0273079 A1 | 11/2011 | Pickard et al. | |
| 2012/0007130 A1* | 1/2012 | Hoelen | H01L 33/504 257/98 |
| 2012/0043552 A1 | 2/2012 | David et al. | |
| 2014/0175478 A1* | 6/2014 | Wirth | G02B 5/0278 257/98 |

FOREIGN PATENT DOCUMENTS

| | | |
|---|---|---|
| EP | 2 490 258 A2 | 8/2012 |
| WO | 2012/022813 A1 | 2/2012 |
| WO | 2012/121304 A1 | 9/2012 |

* cited by examiner

LED LIGHT SYSTEM

RELATED APPLICATIONS

This is a continuation of International Application No. PCT/EP2013/069885, with an international filing date of Sep. 24, 2013 (WO 2014/067716, published May 8, 2014), which is based on German Patent Application No. 10 2012 219 873.3-33, filed Oct. 30, 2012.

TECHNICAL FIELD

This disclosure is based on a light system having color locus stabilization. Such light systems are suitable in particular for general lighting.

BACKGROUND

U.S. Pat. No. 6,234,648 discloses a light system in which blue LEDs and red LEDs are used together with a phosphor that converts the radiation of the blue LED into green radiation.

DE 10 2010 034 913 discloses materials for LEDs having a temperature-dependent refractive index. The definitions used therein for operating temperature, refractive index and change in the refractive index as thermo-optical coefficient dn/dT shall also be applied hereinafter.

There is a need to provide a light system whose color impression remains as stable as possible at different temperatures. The different temperatures often arise in the start-up phase of operation or in different environments. A white color impression is preferred, but a colored color impression is not ruled out.

SUMMARY

We provide:
1. A light system based on at least one first and one second group of solid-state light sources, wherein a first means for at least partly converting the radiation of at least one first group is disposed in front of the group or each representative of the group or at least one portion of the first group, wherein the first means includes a phosphor-containing layer as conversion means, which layer converts at least one portion of the primary radiation of the first group into secondary radiation having a longer wavelength, wherein the second group emits radiation having a greater wavelength than that of the first group, a second means for at least partly converting the primary radiation of the first group is present, the second means being disposed in front of at least one portion of the first group, wherein the means exhibits a temperature dependence of the conversion, which is based on a different temperature dependence of the refractive index of a phosphor and of a matrix embedding the phosphor, wherein phosphor and matrix are chosen such that at room temperature the difference in the refractive index is small and at operating temperature the difference in the refractive index is at least 1.5 times the magnitude of that at room temperature. Small means that the difference is at most 5%, in particular at most 2%. In particular, a value of 3% has proved to be successful. Room temperature means a temperature of at most 20° C., and operating temperature means a temperature of at least 100° C. Group means at least one element, in particular also a multi-plicity. Solid-state light source means a chip, LED, laser diode, module including such a semiconductor component or the like.
2. The light system according to 1 above, wherein the material of the matrix of the second means is of the silicone type, the refractive index of which decreases as the temperature increases.
3. The light system according to 2 above, wherein the phosphor of the second means is a phosphor having a peak emission in the range of 580 to 660 nm.
4. The light system according to 1 above, wherein the material of the matrix of the second means is of the silicone type, the refractive index of which at room temperature has a value of n=1.39 to 1.55.
5. The light system according to 1 above, wherein the phosphor of the second means a room temperature is similar to that of the matrix, and differs therefrom at most by 3%.
6. The light system according to 1 above, wherein the first group primarily emits blue, with in particular a peak emission in the range of 430 to 470 nm.
7. The light system according to 6 above, wherein the phosphor of the second means has a peak emission in the red spectral range at 580 to 660 nm.
8. The light system according to 1 above, wherein the first group primarily emits UV, with in particular a peak emission in the range of 330 to 400 nm.
9. The light system according to 8 above, wherein the phosphor of the second means has a peak emission in the blue spectral range at 430 to 470 nm.
10. The light system according to 1 above, wherein a phosphor of the second means is selected from the group K2SiF6:Mn, CaF2:Eu and SrF2:Eu, alone or in combination.
11. The light system according to 1 above, wherein the second means additionally includes scattering materials having a suitable refractive index.
12. The light system according to 1 above, wherein the first means includes a phosphor which converts the primary radiation of the first group partly into secondary radiation having a peak wavelength in the range of 480 to 580 nm.
13. The light system according to 1 above, wherein the second means is also disposed in front of the second group or a portion thereof.
14. The light system according to 1 above, wherein the radiation of both groups mixes to form white, in particular having a color temperature in the range of 2300 to 8000 K.
15. The light system according to 1 above, wherein the second means includes a further converting phosphor, the scattering behavior of which is kept low by virtue of the fact that the mean diameter of the phosphor particles d50 is either at least 10 µm or at most 200 nm.
16. The light system according to 1 above, wherein the phosphor of the second means has a mean diameter of the phosphor particles in the range d50=0.8 to 20 µm, preferably to 8 µm.
17. The light system according to 1 above, wherein at least the second means is fitted in a manner spaced apart from the first group on a dome.
18. The light system according to 1 above, wherein the second group primarily emits red, with in particular a peak emission in the range of 580 to 660 nm. LEDs of the InGaAlP type are preferably involved.

BRIEF DESCRIPTION OF THE DRAWINGS

Our systems will be explained in greater detail below on the basis of a plurality of examples.

DETAILED DESCRIPTION

Figure 1:
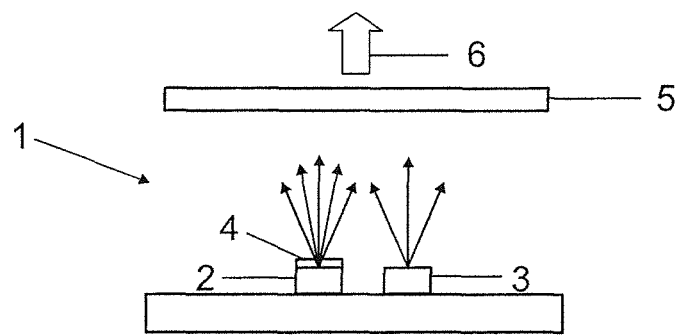
FIG. 1 shows a prior art light system.

We provide a light system having color locus stabilization on the basis of semiconductor components comprising at least two different types of semiconductor components, wherein radiation of a first type of semiconductor components is at least partly converted by a first means for conversion. The radiation of the second type of semiconductor components has a longer wavelength than that of the first semiconductor component, wherein the second semiconductor components are arranged such that their radiation is substantially not absorbed by a phosphor. For the purpose of color locus stabilization, a second means for conversion is disposed in front of the first semiconductor component, the conversion behavior of the second means being temperature-dependent.

In particular, a light system on the basis of a first conversion LED and a second single-colored LED, in particular a red LED, is provided.

We provide light systems such as LED lamps or LED luminaires based on the partial conversion of light from mainly blue or UV LEDs by phosphor combined with other LEDs having a greater wavelength, e.g., red emitting such that overall a specific, mainly white, color impression arises. The partial conversion can either take place in a near-chip manner, or it is possible to use a remote solution in which the LEDs are spatially separated from the phosphor. In this case, the phosphor in a matrix such as plastic/polymer, glass, silicone or the like can be fitted, e.g., as a type of dome or plate above the LEDs. Since the efficiency of the blue LEDs, which are generally based on InGaN, and of the second LEDs having a longer wavelength, namely red LEDs, which are generally based on InGaAlP, varies differently as the temperature increases, an increase in temperature leads to a shift in the color locus. In general, the light system emits more red light at room temperature, or shortly after switch-on than under operating conditions (i.e., at a higher temperature than room temperature) if no counter measures are implemented.

Peak emission of the first LED having a shorter wavelength is generally 350 to 460 nm; the peak emission of the second LED having a longer wavelength is generally at least 500 nm, often at least 570 nm.

There are various approaches to compensate for the color locus shift:
1. Active regulation of the currents for first, in particular blue, and second, in particular red, LEDs depending on temperature. This variant has the disadvantage that the electronic driver required for the regulation is very complex and thus expensive.
2. Use of suitable phosphors or phosphor mixtures such that the spectrum of the converted first, advantageously blue, LEDs leads to a partial compensation of the color locus shift. In this case, it is possible to make use of the fact that, e.g., the peak wavelength of the blue LEDs shifts in one direction with the temperature and, in some phosphors or phosphor mixtures, this is accompanied by a change in the emission spectrum thereof or else the relative absorption or excitability. However, this variant cannot compensate well enough for the color locus shift in a group of two LEDs which emit blue and red.
3. Passive optical element comprising scattering material, e.g., glass particles, are fitted in a matrix, e.g., silicone, above the second, red LED. This exploits the temperature-dependent refractive index of silicone, which decreases as the temperature increases. The difference is approximately 0.035 between room temperature and 125° C. In contrast, the refractive index of glass is almost constant in this temperature range. If the scattering materials are matched in terms of refractive index such that the refractive index of scattering materials and matrix is almost identical under operating conditions, then the scattering effect is minimal under operating conditions, while a greater difference in refractive index and thus a higher scattering effect is present at room temperature. The passive optical element therefore has the effect that scattering losses for the light of the second, red LEDs occur at room temperature, while the light of the red LEDs is emitted for the most part without disturbance under operating conditions. This results in a reduction of the color locus shift with the temperature. The effect can be reinforced by additional absorber materials in the matrix. This variant has the disadvantage that a proportion of the emitted light is lost even under operating conditions since the optical element does not become perfectly transparent. As a result, under operating conditions and primarily at relatively low temperatures, light is annihilated and, as a result, efficiency is reduced or more red LEDs are required and the costs are increased as a result.
4. Use of a wavelength-dependent absorber material or filter. This exploits the effect that the emission of the red LEDs shifts toward longer wavelengths as the temperature increases. A filter having a steep transmission curve is therefore intended to be used such that part of the emission is absorbed at room temperature, while the light of the red LEDs is transmitted with as little hindrance as possible under operating conditions. A disadvantage with this variant is likewise that light is intentionally annihilated and a certain residual loss is typically present even under operating conditions.

As a solution to the problem, we primarily provide the use of an additional temperature-dependent converter element disposed in front of at least the first group of LEDs and emits in a spectral range within the wavelength range of the second group of semiconductor components. Preferably, emission of at least one of the converter materials contained in the temperature-dependent converter element does not differ, or differs only slightly, from emission of the second semiconductor component. This can be achieved, for example, by the suitable coordination of the respective peak or dominant wavelengths of both emission spectra. In particular, by way of example, both emission spectra can lie in the red spectral range.

The element consists of one or else a plurality of phosphors in a suitable matrix. At least one phosphor which emits secondary radiation within the range of the emission of the second semiconductor element and matrix are chosen here such that the difference in their refractive indexes at low temperatures, e.g., at room temperature or shortly after the lamp has been switched on is very small, while the difference in their refractive indexes at higher temperatures, e.g., under the operating conditions of the lamp, is larger. As a result, the light which penetrates through the temperature-dependent converter element is scarcely scattered at low temperatures and the optical path length is relatively short, such that little light of the first LED, namely blue, can be absorbed and converted by the phosphor. At higher temperatures, the light is scattered to a greater extent, the optical path length becomes longer and more blue light is absorbed or converted. Overall, the phosphor of the temperature-dependent converter element, which phosphor emits in the spectral range of the second semiconductor element, in particular emits red, for example, is therefore almost "invisible" at room temperature, i.e., it does not become perceptible, while at higher temperature the refractive index of the matrix changes and the scattering and absorption of the light by the temperature-dependent converter element thus become greater.

If appropriate, the element can also comprise an inorganic filler. In accordance with one example, the inorganic filler can comprise or consist of a glass, quartz, silica gel, $SiO_2$ particles, in particular spherical $SiO_2$ particles, a borosilicate glass or a combination thereof. By way of example, $SiO_2$ particles have a refractive index at room temperature of 1.46, glass has a refractive index at room temperature of 1.45 to 2.14, and a borosilicate glass has a refractive index at room temperature of 1.50 to 1.55.

In accordance with a further example, the filler comprises or consists of a silicate, a ceramic or an aluminum oxide, for example, corundum.

In accordance with a further example, the matrix material can comprise or consist of a silicone, an epoxy resin, an acrylic resin, a polyurethane, a polycarbonate or a combination thereof. The matrix material can also comprise or consist of a mixture of different plastics and/or silicones. The matrix material can comprise or consist of, in particular, a silicone, a methyl-substituted silicone, for example, poly (dimethylsiloxane) and/or polymethylphenylsiloxane, a cyclohexyl-substituted silicone, for example, poly(dicyclohexyl)siloxane or a combination thereof.

By way of example, an epoxy resin or an acrylic resin can have a refractive index at room temperature of 1.46 to 1.60, in particular of 1.48 to 1.53. A polycarbonate generally has a higher refractive index, for example, 1.55 to 1.65, in particular 1.58 to 1.60. A silicone has a refractive index of 1.40 to 1.54.

The refractive index of the matrix material is particularly advantageously set such that at room temperature it is higher than the refractive index of the filler since the thermo-optical coefficient of the matrix material is often higher than the thermo-optical coefficient of the filler and, consequently, the refractive index of the matrix material decreases faster than the refractive index of the filler as the temperature increases during operation of the component.

Silicone, for example, which exists in different variants having refractive indexes of between approximately 1.39 and 1.55, is suitable as matrix material of the temperature-dependent converter element. In this case, the refractive index of silicone depends on the temperature to a comparatively greater extent and decreases as the temperature increases. All materials which have a refractive index similar to that of the matrix material at relatively low temperatures are suitable as phosphor of the temperature-dependent converter element. The difference should not be greater than 10%, better at most 5%.

In principle, all phosphors are suitable which absorb the light of the blue LEDs and then emit it in secondary form at a greater wavelength. Red-emitting phosphors are primarily of interest, but also orange- or green-emitting phosphors. In the former case, at relatively high temperatures more blue light is converted into red light than at low temperatures. It is thus possible to improve and stabilize the color locus shift in a system comprising first and second LEDs such that there is less of a shift in the color locus between switch-on and obtaining the operating conditions. In principle, it is also possible to use, if additionally appropriate, phosphors which do not emit in the red spectral range. It is therefore possible to influence the color locus in a manner dependent on the temperature. This holds true, in particular, if a UV-emitting LED is used as the first LED (or group of LEDs). It is then possible to use, e.g., a phosphor which absorbs in the UV range and emits in the blue spectral range. Examples of a suitable phosphor are phosphors of the basic type BAM or SCAP such as are known in principle.

In this case, this blue-emitting phosphor can be fitted above a UV LED and thus, depending on temperature, more or less additional blue light can be generated, which in turn can be converted further again by a yellow, green or red phosphor.

The refractive index of a silicone depends, in particular, on the organic substituents $R^1$, $R^2$ and $R^3$ on the silicon atom and according to the degree of branching of the silicone. Terminal groups of the silicone can be described by $R^1R^2R^3SiO_{1/2}$, linear groups by $R^1R^2SiO_{2/2}$, and branching groups by $R^1SiO_{3/2}$. $R^1$ and/or $R^2$ and/or $R^3$ can be chosen independently on each silicon atom. In this case, $R^1$, $R^2$ and $R^3$ are chosen from a variation of organic substituents having a different number of carbon atoms. The organic substituents can be in an arbitrary ratio to one another in a silicone. In general, a substituent has 1 to 12, in particular 1 to 8, carbon atoms. By way of example, $R^1$, $R^2$ and $R^3$ are chosen from methyl, ethyl, cyclohexyl or phenyl, in particular methyl and phenyl. Organic substituents having many carbon atoms generally increase the refractive index, while smaller substituents lead to a lower refractive index. By way of example, a silicone rich in methyl groups can have a low refractive index, for example, of 1.40 to 1.44. In contrast, a silicone rich in phenyl groups or cyclohexyl groups, for example, can have a higher refractive index.

Generally, by way of example, $K_2SiF_6$:Mn, CaF2:Eu, SrF2:Eu are appropriate as material system for the temperature-dependent phosphor. Besides the phosphor, scattering materials having a suitable refractive index can also additionally be admixed. Various examples are possible for this fundamental concept. In the case of near-chip conversion of the first, blue LEDs into, e.g., green or yellow or red light, our systems can be realized as follows:

The temperature-dependent conversion element can be disposed in front of each blue LED, or else only a portion of the blue LEDs.

The element can also be disposed in front of all the blue LEDs jointly.

The element can be disposed in front of first, blue, LEDs and second, red, LEDs jointly. In this case, the red light of the LEDs under operating conditions is scattered only to a slightly greater extent, but is hardly absorbed.

The temperature-dependent conversion element can have direct contact with the associated LEDs in one example, and in a second example it can also be fashioned as a remote element, e.g., as a plate or dome above the LEDs. In that case it has no direct contact with the LEDs.

Moreover, the combinations of these examples are also possible if the conversion of the blue LEDs into, e.g., green/yellow/red light does not take place by near-chip conversion, but rather by spaced-apart conversion. If both conversion layers are fashioned as spaced apart, various examples are possible, in principle, for the order of the remote elements. In addition, the elements can optionally be fitted above all the LEDs or only above a portion of the LEDs.

Many established conversion techniques are suitable to introduce the phosphors in the temperature-dependent conversion element. By way of example, this includes laminae—produced by screen printing, blade coating or by spraying—composed of phosphor and a matrix material or else volume potting, sedimentation or electrophoretic deposition. In addition, production methods such as injection molding and extrusion can be used.

The scattering effect can also be reinforced by adding scattering materials having rather a suitable refractive index.

The conversion effect in the temperature-dependent converter element can be reinforced by adding further phosphors. In particular, these are phosphors which are either very coarse-grained or very fine-grained. This is taken to mean, in particular, on the one hand phosphors having a d50 of at least 10 μm, and on the other hand phosphors having a d50 of less than 200 nm. Such additions are of interest because in this case their scattering effect is relatively small and, therefore, the effect of the solution is scarcely influenced even at low temperatures. Therefore, under these circumstances, it is also possible to use phosphors whose refractive index deviates from that of the matrix. As very fine-grained phosphors it is also possible to use, in particular, quantum dots, e.g., in the form of colloidal quantum dots. Suitable materials for quantum dots are, for example, semiconductor materials from the III-V, II-VI or I-III-V12 groups, e.g., GaP, InP, ZnS, ZnSe, ZnTe, CdS or CdSe. To improve the properties (e.g., optical properties, stability, solubility), the quantum dots can be embodied as a core/shell structure or contain ligands.

Use of a temperature-dependent conversion element affords a series of advantages. In contrast to what happens in other techniques mentioned in the introduction, light is not intentionally annihilated either shortly after switch-on or under operating conditions. The missing long-wave, namely red, light is merely compensated for at relatively high temperatures by an additional red conversion of the light of the first LED, namely involving blue light. The color locus stabilization is therefore not obtained by a destructive temperature-dependent absorption, but rather on the contrary by a constructive temperature-dependent conversion. Significant advantages in respect of efficiency should therefore arise.

Since a passive optical element is involved, this solution is significantly more expedient compared to active electronic regulation.

In addition, the scattering effect of the temperature-dependent conversion element makes it possible to improve the emission properties of the light system, such as, e.g., a more homogeneous intensity distribution as a function of the emission angle or a more homogeneous distribution of the color properties as a function of the emission angle.

Proposed phosphors suitable for use in the second means include, in particular, garnets, orthosilicates, chlorosilicates, nitridosilicates and the derivatives thereof such as, in particular:

(Ca,Sr)8Mg(SiO4)4Cl2:Eu2+
(Sr,Ba,Lu)2Si(O,N)4:Eu2+
(Sr,Ba,Ln)2Si(O,N)4:Eu2+ with Ln selected from the lanthanides with the possibility of also using more than one lanthanide for Ln
(Sr,Ba)Si2N2O2:Eu2+
(Y,Gd,Tb,Lu)3(Al,Ga)5O12:Ce3+
(Ca,Sr,Ba)2SiO4:Eu2+
(Sr,Ba,Ca,Mg)2Si5N8:Eu2+
(Sr,Ca)AlSiN3:Eu2+
(Sr,Ca)S:Eu2+
(Sr,Ba,Ca)2(Si,Al)5(N,O)8:Eu2+
(Sr,Ba,Ca)2Si5N8:Eu2+
(Sr,Ba,Ca)3SiO5:Eu2+
α-SiAlON:Eu2+
Ca(5-δ)Al(4-2δ)Si(8+2δ)N18O:Eu2+

Turning now to the Drawings, FIG. 1 shows construction of a light system 1 for white light on an RGB basis as known per se, for example, see US-B 7,213,940. The light source comprises as semiconductor component a first group or at least one blue LED 2 of the InGaN type having a peak emission wavelength of 450 nm, for example. The array furthermore contains as second group or else at least one red-emitting LED 3. As a first conversion means, a yellow- or green-emitting first phosphor 4, such as, e.g., YAG:Ce (yellow) or else green SiAlON, is disposed in front of the first group, here the first LED 2, in a near-chip manner. The system mixes to form white (6), for example, having a color temperature of 2600 K.

A diffusing plate 5 is optionally disposed in front of the entire module, for better homogenization.

Figure 2:
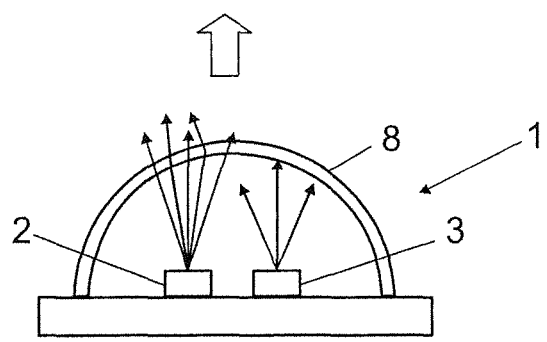
FIG. 2 shows a second prior art light system.

FIG. 2 shows a different arrangement of a previously known light system 1, once again comprising first LED (2) and second LED (3) as in FIG. 1. In this case, the first means for conversion is arranged in a manner spaced apart from the first group on a dome 8. A so-called remote phosphor concept is involved. The dome can additionally contain scattering material.

Figure 3:
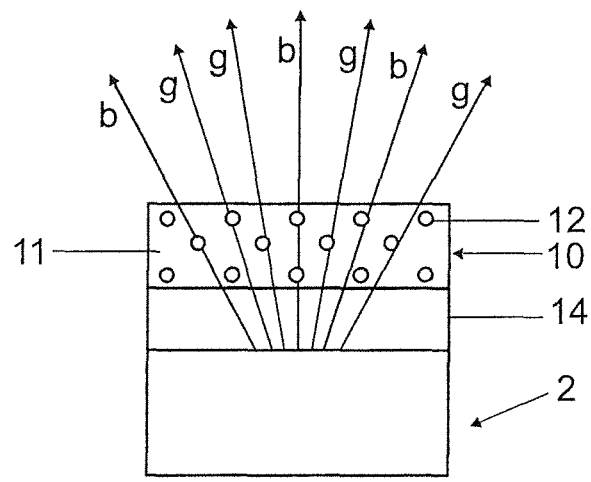
FIGS. 3-5, 6a-b, 7a-b, 8-9, 10a-b, 11a-b and 12a-b show various examples of our novel light systems.

FIG. 3 shows in detail a first example according to our system, specifically in the state at low temperature, in particular room temperature. In this case, the mode of operation of the first group of LEDs is explained. The second group is not shown here, being similar to that in FIG. 1 or 2.

A representative of the first group here comprises a blue (b) emitting LED 2. As first means for conversion, a layer 14 composed of partly converting phosphor, similar to the first phosphor mentioned in FIG. 1 or 2, is applied directly to the LED. The converted radiation is designated by g.

In addition, as second means a further second layer 10 is disposed in front of the first means. The layer is applied directly to the first means. The second layer 10 comprises at least two components, specifically a matrix composed of silicone 11 and a phosphor 12 having a greatly temperature-dependent refractive index, illustrated highly schematically. The phosphor is K2SiF6:Mn, in particular. The latter has a refractive index at room temperature of approximately 1.4 and is thus particularly well suited to interaction with silicone.

At a low temperature of typically 20° C., the difference in refractive index between matrix 11 and second temperature-dependent phosphor 12 is relatively small, for example, less than 5%, specifically here approximately 3%. Therefore, the scatter and thus the optical path length of the light are very small. Therefore, the rate of conversion of the blue primary radiation into red secondary radiation is also so low that it plays no significant part technically.

Figure 4:
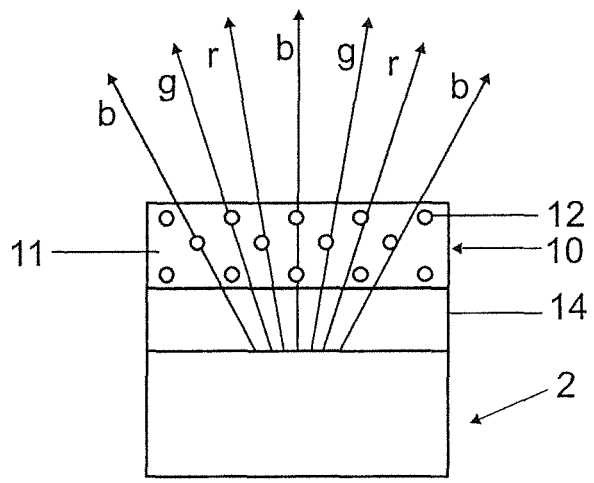

FIG. 4 shows the conditions for the first example at high temperature, typically 80 to 180° C. in the operating state. At this temperature the difference in refractive index between a second phosphor 12 and embedding matrix 11 is significantly higher, e.g., 3 times as high as at room temperature. Consequently, blue light of the LEDs of the first group is converted into red light (r) to an appreciable extent. As a result, the color locus shift is at least partly compensated for again in comparison with the initial phase immediately after the start, as depicted in FIG. 3.

Figure 5:
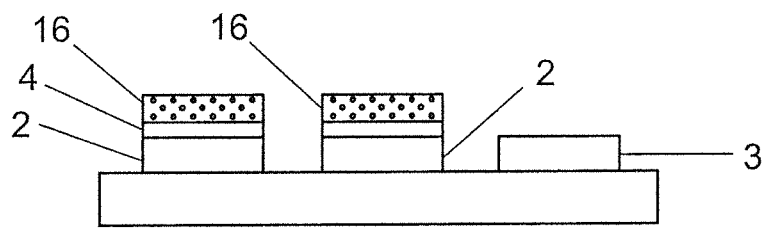

FIG. 5 schematically shows a further example, wherein the first group consists of two LEDs 2, in front of each of which a dedicated second means 16 is disposed.

Figure 6A:
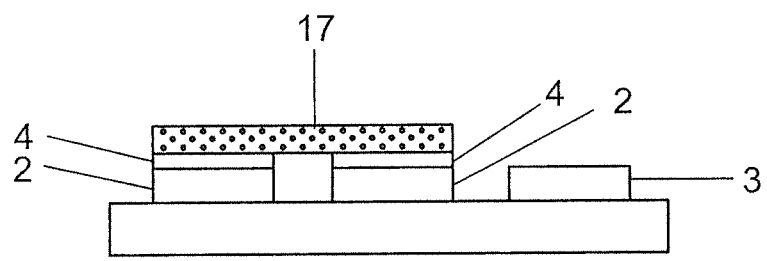

FIG. 6a shows an example in which a spanning lamina 17 comprising the second means is disposed in front of a group of two blue LEDs (first group). Each first LED 2 has the converting first means 4 in a near-chip manner.

Figure 6B:
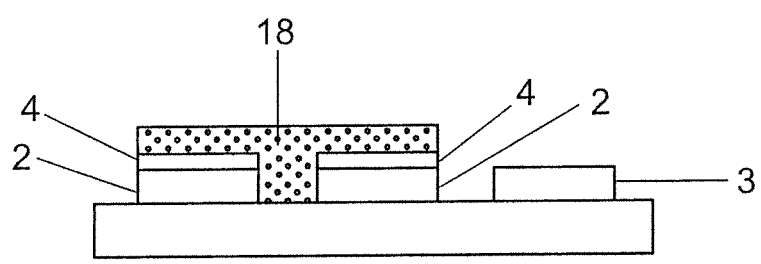

FIG. 6b shows an example in which the second means is not a separate lamina, but rather a potting 18 situated not only in each case in front of the blue LEDs 2 in the beam path but also laterally between the two LEDs 2.

Figure 7A:
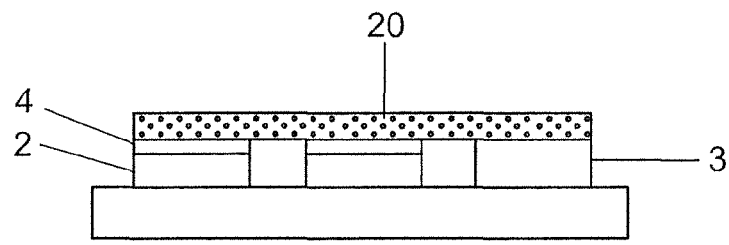
Figure 7B:
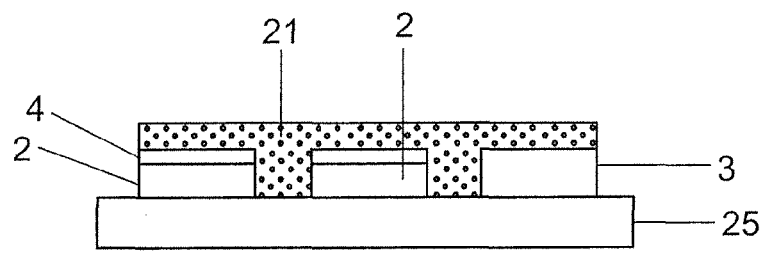

FIG. 7a shows an example analogous to FIG. 6a in which the second means as lamina 20 extends not only over the first group, represented here by two blue LEDs 2, but also over the second group, represented by a red-emitting LED 3. Alternatively, in accordance with FIG. 7b, the second means as potting 21 again can also extend to the interspaces between the semiconductor elements 2, 2, 3.

Figure 8:
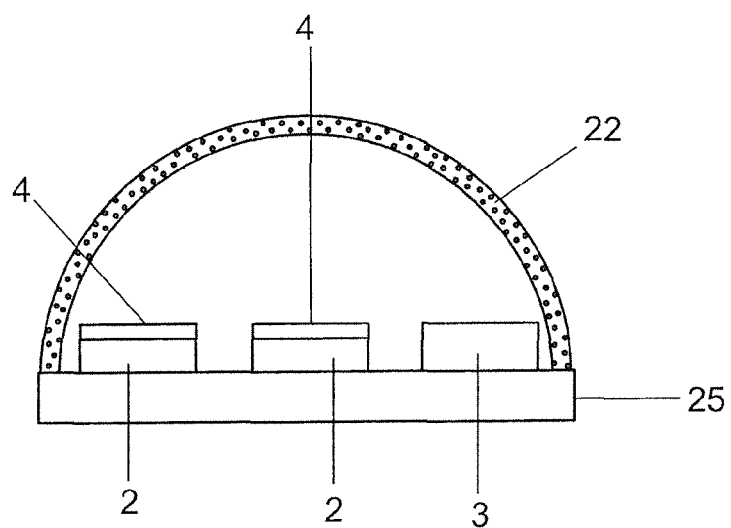

FIG. 8 shows a module in which the first and second groups of LEDs 2, 2, 3 are situated jointly on a substrate 25. The first group has near-chip conversion means 4 as first means, for conversion into yellow/green. The temperature-dependent second means 22 is introduced in a dome spanning all the light sources or is applied on the dome.

Figure 9:
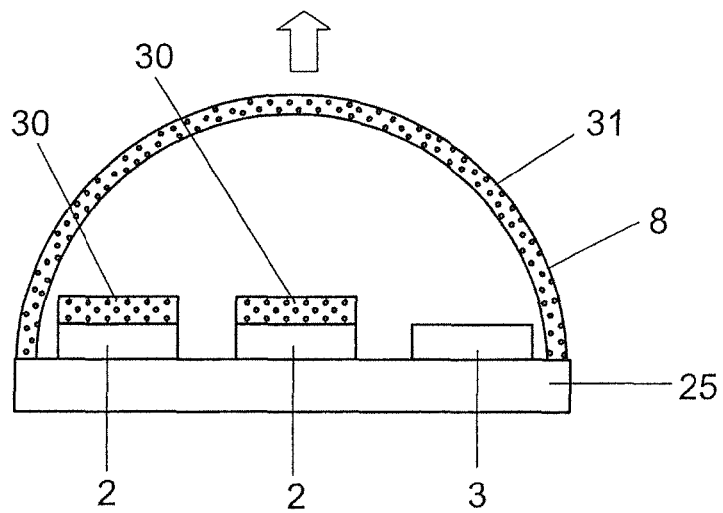

FIG. 9 shows as light system a white-emitting LED module in which the second means 30 is applied directly to the LEDs 2 of the first group of light sources in a near-chip manner. First group (2) and second group (3) are applied jointly to a substrate 25. A dome 8 spans both groups jointly, wherein the dome comprises the first conversion means 31. This arrangement is particularly well suited to the compensation since the first means 31 is not exposed to excessively high thermal loading, that is to say that a certain temperature sensitivity of the refractive index of the first phosphor can also be accepted. Conversely, the temperature-sensitive second phosphor in the second means 30 is exposed to a maximum difference in temperature, and can thus fully manifest its regulating function.

Figure 10A:
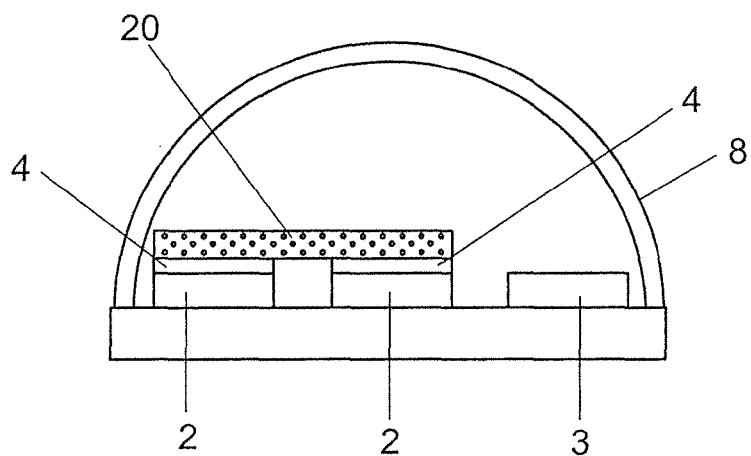

FIG. 10a shows a light system which is constructed in a manner similar to that in FIG. 9, but here the temperature-dependent converter element as lamina 20 extends over both first LEDs 2.

Figure 10B:
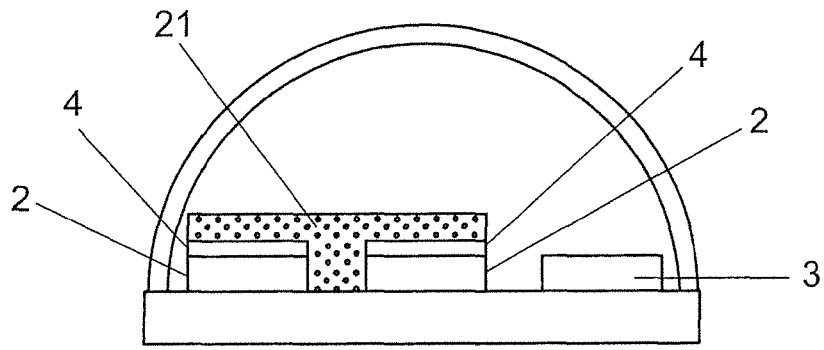

FIG. 10b shows a similar light system, wherein the temperature-dependent converter element as potting 21 also extends between the two blue LEDs 2.

Figure 11A:
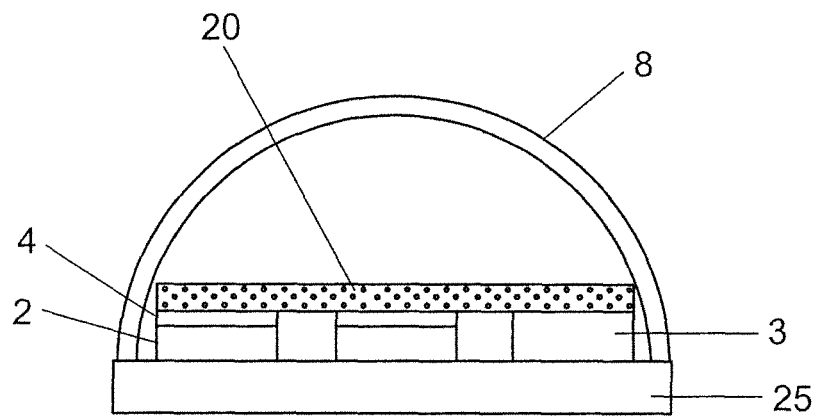

FIG. 11a shows a similar light system, wherein, however, the lamina 20 comprising the second means also extends over the LED 3 of the second group.

Figure 11B:
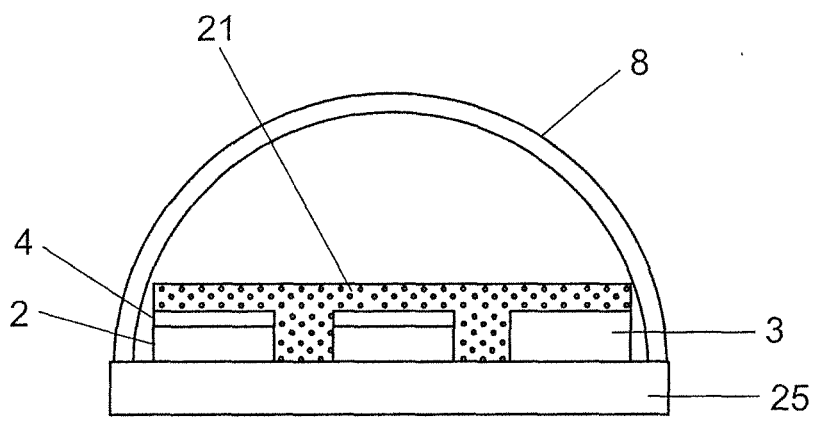

FIG. 11b shows a similar light system, wherein the temperature-dependent converter element 21 also extends between the blue (2) and red (3) LEDs.

Figure 12A:
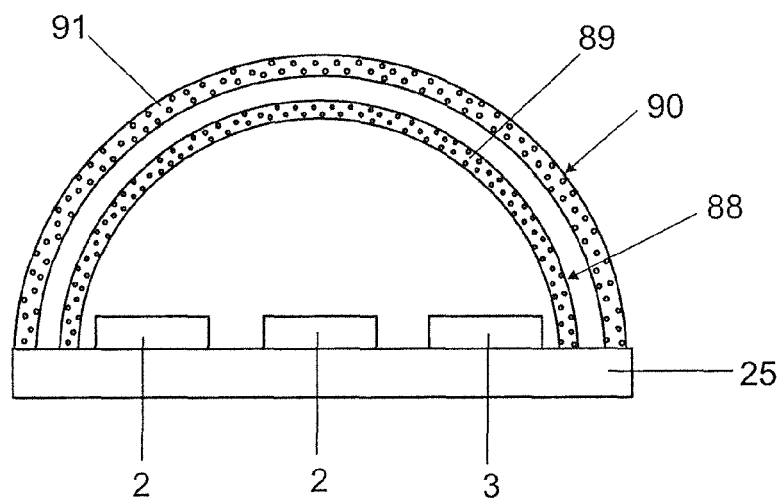

FIG. 12a shows a particularly preferred example of an LED module constructed in a manner similar to that described in FIG. 8. In contrast thereto, blue (2) and red (3) LEDs are mounted in each case without phosphor on the substrate 25. They are spanned by a first dome 88 containing the second means 89, that is to say the temperature-dependent converter element. The first dome is spanned outside the latter by a second dome 90 containing the first means 91, that is to say the temperature-independent phosphor which emits yellow or green. The first and second means can be interchanged in their order.

Figure 12B:
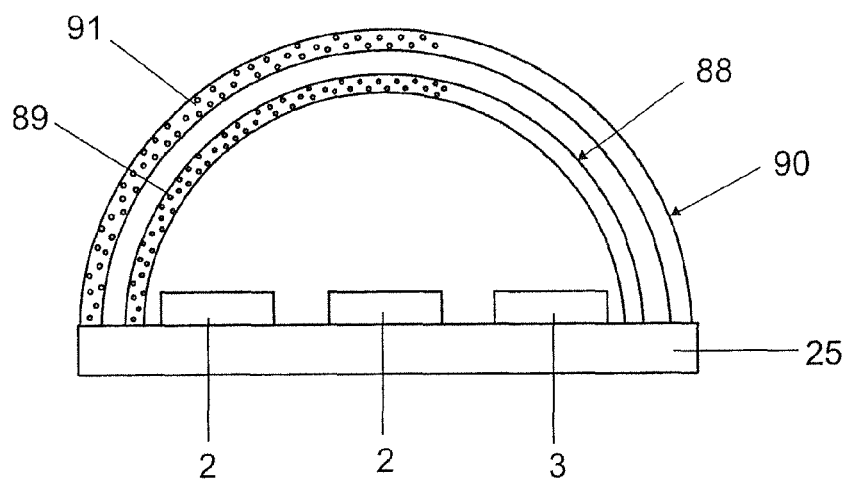

FIG. 12b shows a further example similar to FIG. 12a, but the first and second means are positioned in each case only above a portion of the LEDs, namely over the LEDs 2 of the first group.

The invention claimed is:

1. A light system based on at least one first and one second group of solid-state light sources, wherein a first device that at least partly converts the radiation of at least one first group is disposed in front of said group or each representative of said group or at least one portion of said first group, wherein the first device comprises a phosphor-containing layer as a converter, which layer converts at least one portion of the primary radiation of the first group into secondary radiation having a longer wavelength, wherein the second group emits radiation having a greater wavelength than that of the first group, a second device that at least partly converting the primary radiation of the first group is present, said second device being disposed in front of at least one portion of the first group, wherein said converter exhibits a temperature dependence of the conversion, which is based on a different temperature dependence of the refractive index of a phosphor and of a matrix embedding the phosphor, and wherein phosphor and matrix are chosen such that at room temperature a difference in the refractive index is small and at operating temperature the difference in the refractive index is at least 1.5 times the magnitude of that at room temperature.

2. The light system as claimed in claim 1, wherein the material of the matrix of the second device is a silicone, the refractive index of which decreases as the temperature increases.

3. The light system as claimed in claim 2, wherein the phosphor of the second device is a phosphor having a peak emission in the range of 580 to 660 nm.

4. The light system as claimed in claim 1, wherein the material of the matrix of the second device is a silicone having refractive index at room temperature of n=1.39 to 1.55.

5. The light system as claimed in claim 1, wherein the phosphor of the second device at room temperature is similar to that of the matrix, and differs therefrom at most by 3%.

6. The light system as claimed in claim 1, wherein the first group primarily emits blue, with a peak emission of 430 to 470 nm.

7. The light system as claimed in claim 6, wherein the phosphor of the second device has a peak emission in the red spectral range at 580 to 660 nm.

8. The light system as claimed in claim 1, wherein the first group primarily emits UV, with a peak emission of 330 to 400 nm.

9. The light system as claimed in claim 8, wherein the phosphor of the second device has a peak emission in the blue spectral range at 430 to 470 nm.

10. The light system as claimed in claim 1, wherein a phosphor of the second device is at least one selected from the group K2SiF6:Mn, CaF2:Eu and SrF2:Eu.

11. The light system as claimed in claim 1, wherein the second device further comprises scattering materials having a suitable refractive index.

12. The light system as claimed in claim 1, wherein the first device comprises a phosphor which converts the primary radiation of the first group partly into secondary radiation having a peak wavelength of 480 to 580 nm.

13. The light system as claimed in claim 1, wherein the second device is also disposed in front of the second group or a portion thereof.

14. The light system as claimed in claim 1, wherein the radiation of both groups mixes to form white light having a color temperature of 2300 to 8000 K.

15. The light system as claimed in claim 1, wherein the second device comprises a further converting phosphor, the scattering behavior of which is kept low by a mean diameter of the phosphor particles d50 being either at least 10 μm or at most 200 nm.

16. The light system as claimed in claim 1, wherein the phosphor of the second device has a mean diameter of the phosphor particles at d50=0.8 to 20 μm.

17. The light system as claimed in claim 1, wherein at least the second device is fitted in a manner spaced apart from the first group on a dome.

\* \* \* \* \*